US012615816B2

(12) United States Patent
Miller et al.

(10) Patent No.: US 12,615,816 B2
(45) Date of Patent: Apr. 28, 2026

(54) FLEXIBLE SELF-ALIGNED POWER VIA SHAPE WITH GATE CUT FIRST

(71) Applicant: INTERNATIONAL BUSINESS MACHINES CORPORATION, Armonk, NY (US)

(72) Inventors: Eric Miller, Albany, NY (US); John Christopher Arnold, North Chatham, NY (US); Kisik Choi, Watervliet, NY (US); Ruilong Xie, Niskayuna, NY (US)

(73) Assignee: International Business Machines Corporation, Armonk, NY (US)

( * ) Notice: Subject to any disclaimer, the term of this patent is extended or adjusted under 35 U.S.C. 154(b) by 447 days.

(21) Appl. No.: 18/186,227

(22) Filed: Mar. 20, 2023

(65) Prior Publication Data

US 2024/0321957 A1     Sep. 26, 2024

(51) Int. Cl.
H10D 62/10         (2025.01)
H10D 30/01         (2025.01)
(Continued)

(52) U.S. Cl.
CPC ......... H10D 62/121 (2025.01); H10D 30/014 (2025.01); H10D 30/43 (2025.01); H10D 30/6735 (2025.01); H10D 30/6757 (2025.01); H10D 64/017 (2025.01); H10D 84/0186 (2025.01); H10D 84/0188 (2025.01);
(Continued)

(58) Field of Classification Search
CPC .. H10D 30/014; H10D 30/43; H10D 30/6735; H10D 62/121; H01L 23/5286; H01L 21/768; H01L 21/76895; H01L 21/76898
See application file for complete search history.

(56) References Cited

U.S. PATENT DOCUMENTS 9,570,395 B1     2/2017   Sengupta
10,586,765 B2    3/2020   Smith
(Continued)

OTHER PUBLICATIONS

Gupta et al., "Buried Power Rail Integration with Si FinFETs for CMOS Scaling beyond the 5 nm Node", 2020 Symposium on VLSI Technology Digest of Technical Papers—THL.6, 2020 IEEE, 2 pp.
(Continued)

*Primary Examiner* — Tuan A Hoang
(74) *Attorney, Agent, or Firm* — Samuel A. Waldbaum

(57)          ABSTRACT
A microelectronic device including a first nanosheet transistors adjacent to a second nanosheet transistor. The first nanosheet transistor includes a plurality of first nanosheets, and the second nanosheet transistor includes a plurality of second nanosheets. A source/drain located between the first nanosheet transistor and second nanosheet transistor. A first gate wraps around the plurality of first nanosheets. A second gate wraps around the plurality of second nanosheets. A first upper spacer located adjacent to the first gate, where the first upper spacer is in contact with at least three sides of the first gate. A second upper spacer located adjacent to the second gate, where the second upper spacer is in contact with at least three sides of the second gate. A backside interconnect connected to the source/drain, where the backside interconnect is in contact with the first upper spacer and the second upper spacer.

18 Claims, 18 Drawing Sheets

TOP DOWN VIEW

(51) Int. Cl.

| | |
|---|---|
| *H10D 30/43* | (2025.01) |
| *H10D 30/67* | (2025.01) |
| *H10D 64/01* | (2025.01) |
| *H10D 84/01* | (2025.01) |
| *H10D 84/03* | (2025.01) |
| *H10D 84/85* | (2025.01) |
| *H10W 20/20* | (2026.01) |

(52) U.S. Cl.
CPC .......... *H10D 84/038* (2025.01); *H10D 84/85* (2025.01); *H10W 20/20* (2026.01)

(56) References Cited

U.S. PATENT DOCUMENTS

| | | | |
|---|---|---|---|
| 10,607,938 | B1 | 3/2020 | Rubin |
| 10,636,739 | B2 | 4/2020 | Beyne |
| 10,700,207 | B2 | 6/2020 | Chen |
| 11,355,601 | B2 | 6/2022 | Chiang |
| 11,437,998 | B2 | 9/2022 | Sio |
| 2020/0105671 | A1 | 4/2020 | Lai |
| 2021/0305252 | A1 | 9/2021 | Chiang |
| 2021/0358849 | A1 | 11/2021 | Chen |
| 2021/0376093 | A1 | 12/2021 | Chu |
| 2022/0238388 | A1 | 7/2022 | Hiblot |
| 2024/0128161 | A1* | 4/2024 | Lee ....................... H10W 20/20 |

OTHER PUBLICATIONS

Ryckaert et al., "Extending the roadmap beyond 3nm through system scaling boosters: A case study on Buried Power Rail and Backside Power Delivery", 2019 Electron Devices Technology and Manufacturing Conference (EDTM), 2019 IEEE, pp. 50-52.

* cited by examiner

TOP DOWN VIEW

FIG. 3
CROSS- SECTION Y1

127

130

125
120
114
112
115
114
112
115

108
105
106

FIG. 2
CROSS- SECTION X 125
120
114
112
115
106

108
105

CROSS- SECTION Y2

CROSS- SECTION Y1

CROSS- SECTION X

CROSS- SECTION Y2

CROSS- SECTION Y1

CROSS- SECTION X

CROSS- SECTION Y2

FIG. 12
CROSS- SECTION Y1

155

150

112

135

145

130

108

105

106

FIG. 11
CROSS- SECTION X

155

150

135

116
115
112
150

145

140A

140B

108

105

106

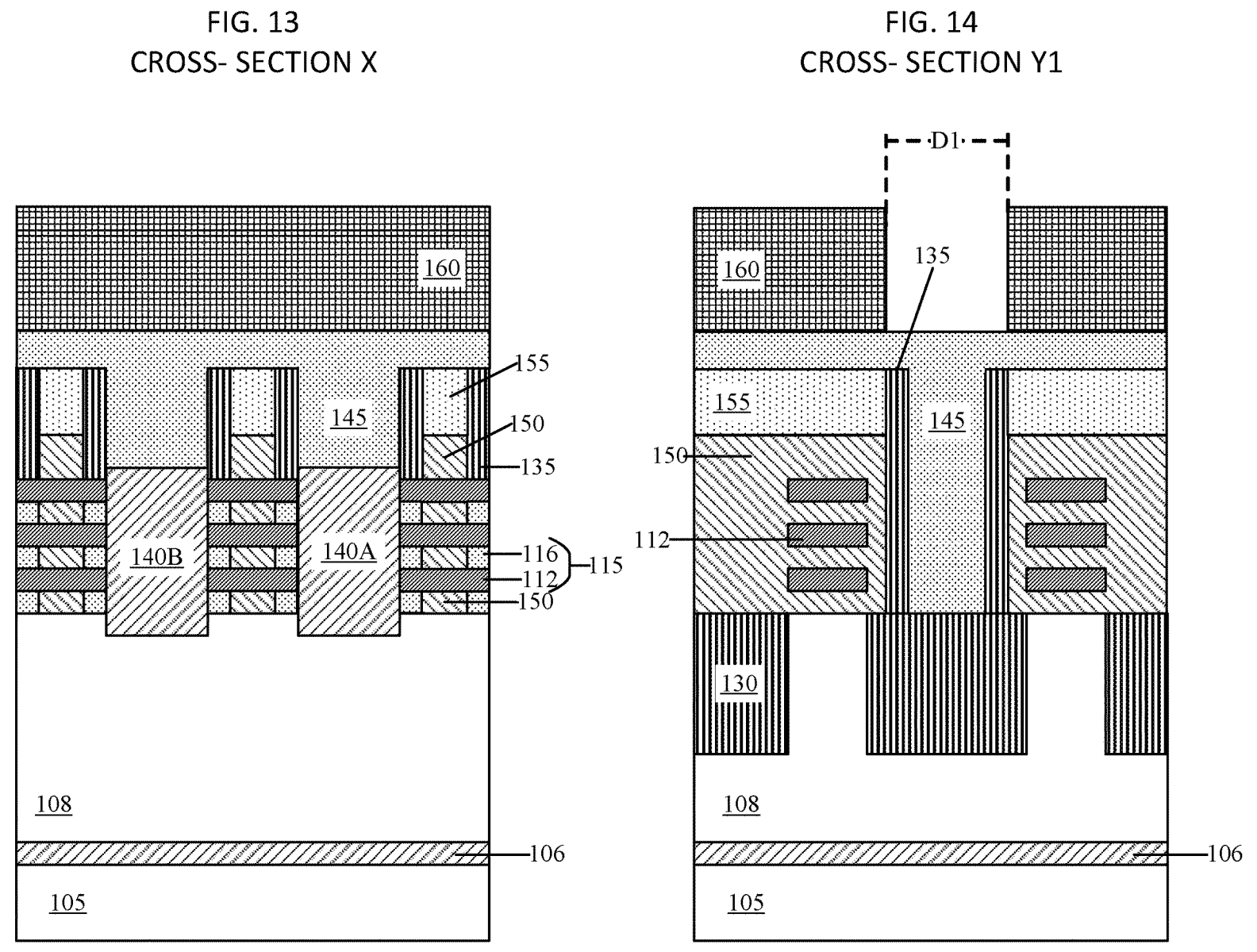

FIG. 14
CROSS- SECTION Y1

160
155
145
135
130
108
105
106
150
112
115
116
112
150

D1

FIG. 13
CROSS- SECTION X 160
155
150
135
145
140A
140B
108
105
106
116
115
112
150

CROSS- SECTION Y2

FIG. 17
CROSS- SECTION Y1

FIG. 16
CROSS- SECTION X

CROSS- SECTION Y2

TOP DOWN VIEW

FIG. 20
CROSS- SECTION Y1

FIG. 19
CROSS- SECTION X

CROSS- SECTION Y2

FIG. 23
CROSS- SECTION Y1

FIG. 22
CROSS- SECTION X

FIG. 24
CROSS- SECTION Y2

105

106

108

130

140A

145

175

W2

175P

140C

190

195

200

CROSS- SECTION Y1

CROSS- SECTION X

FIG. 27
CROSS- SECTION Y2

130
108
140A
145
175
215
W2
175P
140C
190
195
200
210
205

FLEXIBLE SELF-ALIGNED POWER VIA SHAPE WITH GATE CUT FIRST

BACKGROUND

The present invention generally relates to the field of microelectronics, and more particularly to formation of an interconnect that has a large enough width to reduce resistance of the interconnect.

Nanosheet is the lead device architecture in continuing CMOS scaling. However, nanosheet technology has shown issues when scaling down such that as the devices become smaller and closer together, they are interfering with each other. With the number of devices being fit in a smaller area it is becoming harder to form a contact that has a width/length that is large enough so the contact does not have a high resistance.

BRIEF SUMMARY

Additional aspects and/or advantages will be set forth in part in the description which follows and, in part, will be apparent from the description, or may be learned by practice of the invention.

A microelectronic device including a nanosheet transistor that includes a plurality of nanosheets and a gate wrapped around the plurality of nanosheets. An upper spacer located adjacent to the gate, where the upper spacer is in contact with at least three sides of the gate.

A microelectronic device including a first nanosheet transistors adjacent to a second nanosheet transistor. The first nanosheet transistor includes a plurality of first nanosheets, and the second nanosheet transistor includes a plurality of second nanosheets. A source/drain located between the first nanosheet transistor and second nanosheet transistor. A first gate wraps around the plurality of first nanosheets. A second gate wraps around the plurality of second nanosheets. A first upper spacer located adjacent to the first gate, where the first upper spacer is in contact with at least three sides of the first gate. A second upper spacer located adjacent to the second gate, where the second upper spacer is in contact with at least three sides of the second gate. A backside interconnect connected to the source/drain, where the backside interconnect is in contact with the first upper spacer and the second upper spacer.

A method that includes the steps of forming alternating layers on a substrate, where the plurality of alternating layers includes alternating sacrificial layers and channel layers. Separating the alternating layers in to a first stack of alternating layers and a second stack of alternating layers. Forming a shallow trench isolation layer in the substrate in an area of a trench that was formed during the separating the alternating layer. Forming a dummy gate on top of the first stack of alternating layer and the second stack of alternating layers. Patterning the dummy gate into a plurality of separate segments of the dummy gate. Forming an upper spacer around each of the plurality of separate segments of the dummy gate, where the upper spacer is in contact with at least three sides of each of the plurality of separate segments of the dummy gate. Separating the first and second stack of alternating layers into a plurality of columns of the alternating layers, where the separating the first and second stack of alternating layers forms a source/drain region. Forming a gate around the channel layers of the each of the channel layers located in each of the plurality of columns of alternating layers. Forming a backside interconnect connected to a source/drain located in the source/drain region, wherein the backside interconnect is in contact with a first upper spacer and the second upper spacer, where the first upper spacer is located adjacent to a first gate and the second upper spacer is located adjacent to a second gate.

BRIEF DESCRIPTION OF THE DRAWINGS

The above and other aspects, features, and advantages of certain exemplary embodiments of the present invention will be more apparent from the following description taken in conjunction with the accompanying drawings, in which:

FIG. 2 illustrates a cross section X of the nano stack after the formation and patterning of the dummy gate, in accordance with the embodiment of the present invention.

FIG. 3 illustrates a cross section Y1 of the gate region after the formation and patterning of the dummy gate, in accordance with the embodiment of the present invention.

FIG. 11 illustrates a cross section X of the nano stack after the removal of the dummy gate and the plurality of sacrificial layers, and the formation of a gate and a gate cap, in accordance with the embodiment of the present invention.

FIG. 12 illustrates a cross section Y1 of the gate region after the removal of the dummy gate and the plurality of sacrificial layers, and the formation of a gate and a gate cap, in accordance with the embodiment of the present invention.

FIG. 13 illustrates a cross section X of the nano stack after the formation and patterning of a lithography layer, in accordance with the embodiment of the present invention.

FIG. 14 illustrates a cross section Y1 of the gate region after the formation and patterning of a lithography layer, in accordance with the embodiment of the present invention.

Figures 16, 17:
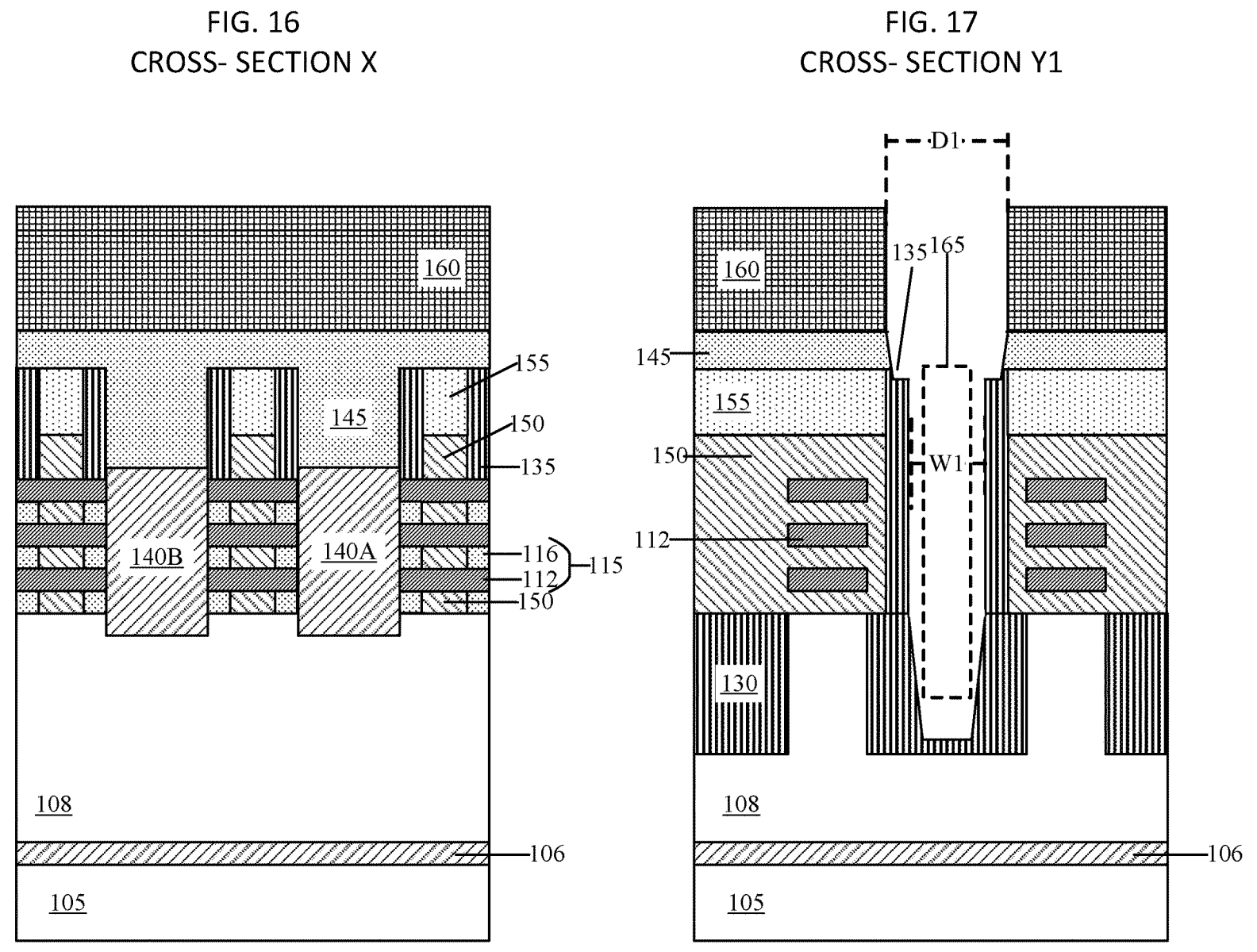

FIG. 16 illustrates a cross section X of the nano stack after the formation of a backside contact trench, in accordance with the embodiment of the present invention.

FIG. 17 illustrates a cross section Y1 of the gate region after the formation of a backside contact trench, in accordance with the embodiment of the present invention.

FIG. 19 illustrates a cross section X of the nano stack after the formation of a plurality of contacts, in accordance with the embodiment of the present invention.

FIG. 20 illustrates a cross section Y1 of the gate region after the formation of a plurality of contacts, in accordance with the embodiment of the present invention.

FIG. 22 illustrates a cross section X of the nano stack after the formation of back-end-of-the-line layers and the carrier wafer, and flipping over the device for backside processing, in accordance with the embodiment of the present invention.

FIG. 23 illustrates a cross section Y1 of the gate region after the formation of back-end-of-the-line layers and the carrier wafer, and flipping over the device for backside processing, in accordance with the embodiment of the present invention.

FIG. 24 illustrates a cross section Y2 of the source/drain region after the formation of back-end-of-the-line layers and the carrier wafer, and flipping over the device for backside processing, in accordance with the embodiment of the present invention.

FIG. 27 illustrates a cross section Y2 of the source/drain region after the formation of a backside-power-distribution-network and a backside contact, in accordance with the embodiment of the present invention.

DETAILED DESCRIPTION

Figure 1:
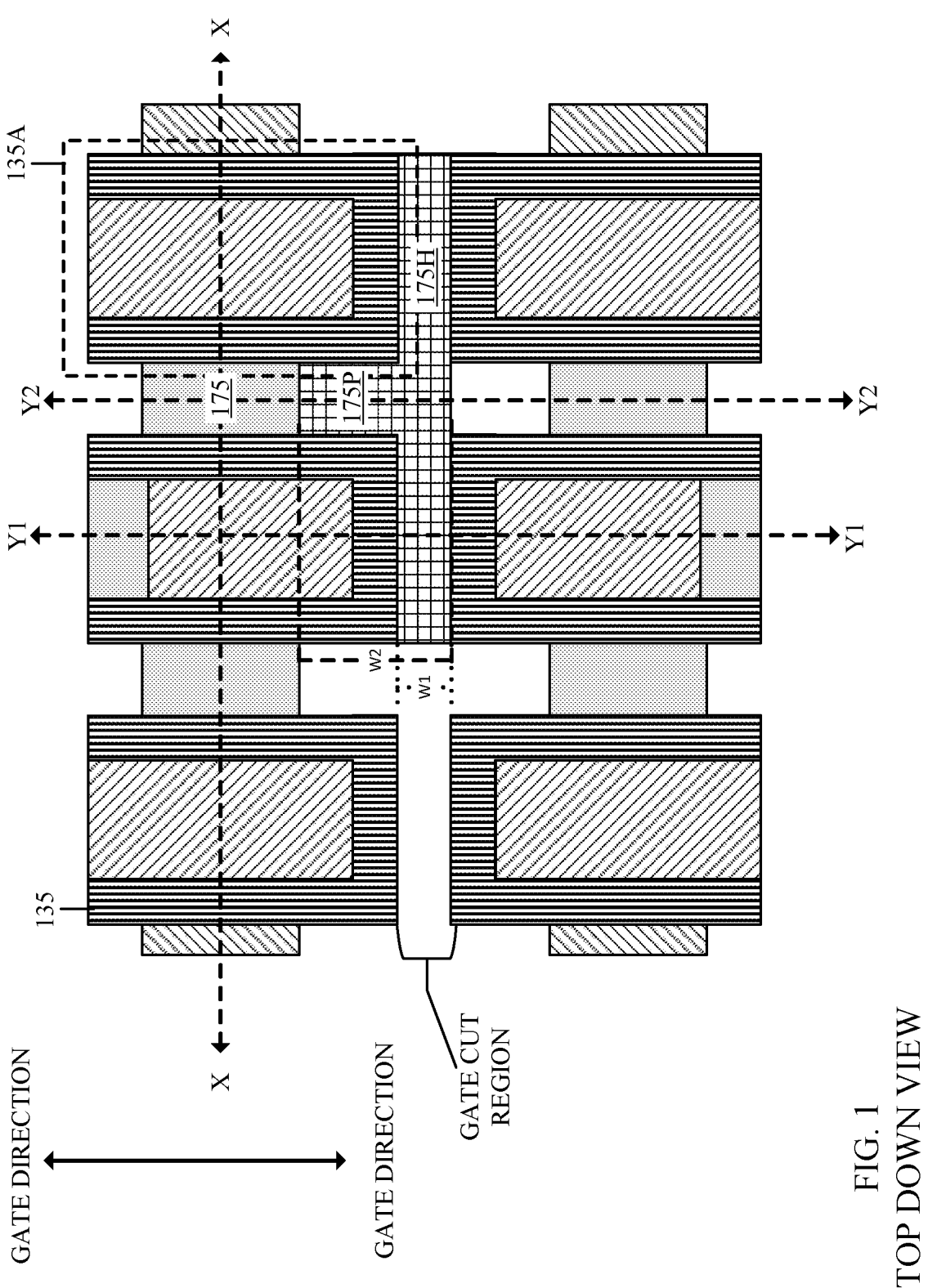
FIG. 1 illustrates a top-down view of multiple nano devices or transistors, in accordance with the embodiment of the present invention.

The following description with reference to the accompanying drawings is provided to assist in a comprehensive understanding of exemplary embodiments of the invention as defined by the claims and their equivalents. It includes various specific details to assist in that understanding but these are to be regarded as merely exemplary. Accordingly, those of ordinary skill in the art will recognize that various changes and modifications of the embodiments described herein can be made without departing from the scope and spirit of the invention. In addition, descriptions of well-known functions and constructions may be omitted for clarity and conciseness.

The terms and the words used in the following description and the claims are not limited to the bibliographical meanings but are merely used to enable a clear and consistent understanding of the invention. Accordingly, it should be apparent to those skilled in the art that the following description of exemplary embodiments of the present invention is provided for illustration purpose only and not for the purpose of limiting the invention as defined by the appended claims and their equivalents.

It is understood that the singular forms "a," "an," and "the" include plural referents unless the context clearly dictates otherwise. Thus, for example, reference to "a component surface" includes reference to one or more of such surfaces unless the context clearly dictates otherwise.

Detailed embodiments of the claimed structures and the methods are disclosed herein: however, it can be understood that the disclosed embodiments are merely illustrative of the claimed structures and methods that may be embodied in various forms. This invention may, however, be embodied in many different forms and should not be construed as limited to the exemplary embodiments set forth herein. Rather, these exemplary embodiments are provided so that this disclosure will be thorough and complete and will fully convey the scope of this invention to those skilled in the art. In the description, details of well-known features and techniques may be omitted to avoid unnecessarily obscuring the present embodiments.

References in the specification to "one embodiment," "an embodiment," an example embodiment," etc., indicate that the embodiment described may include a particular feature, structure, or characteristic, but every embodiment may not include the particular feature, structure, or characteristic. Moreover, such phrases are not necessarily referring to the same embodiment. Further, when a particular feature, structure, or characteristic is described in connection with an embodiment, it is submitted that it is within the knowledge of one of ordinary skill in the art o affect such feature, structure, or characteristic in connection with other embodiments whether or not explicitly described.

For purpose of the description hereinafter, the terms "upper," "lower," "right," "left," "vertical," "horizontal," "top," "bottom," and derivatives thereof shall relate to the disclosed structures and methods, as orientated in the drawing figures. The terms "overlying," "atop," "on top," "positioned on," or "positioned atop" mean that a first element, such as a first structure, is present on a second element, such as a second structure, where intervening elements, such as an interface structure may be present between the first element and the second element. The term "direct contact" means that a first element, such as a first structure, and a second element, such as a second structure, are connected without any intermediary conducting, insulating, or semiconductor layer at the interface of the two elements.

In the interest of not obscuring the presentation of embodiments of the present invention, in the following detailed description, some processing steps or operations that are known in the art may have been combined together for presentation and for illustrative purposes and in some instance may have not been described in detail. In other instances, some processing steps or operations that are known in the art may not be described at all. It should be understood that the following description is rather focused on the distinctive features or elements of various embodiments of the present invention.

Various embodiments of the present invention are described herein with reference to the related drawings. Alternative embodiments can be devised without departing from the scope of this invention. It is noted that various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or indirect coupling, and a positional relationship between entities can be direct or indirect positional relationship. As an example of indirect positional relationship, references in the present description to forming layer "A" over layer "B" includes situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains," or "containing" or any other variation thereof, are intended to cover a non-exclusive inclusion. For example, a composition, a mixture, process, method, article, or apparatus that comprises a list of elements is not necessarily limited to only those elements but can include other element not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiment or designs. The terms "at least one" and "one or more" can be understood to include any integer number greater than or equal to one, i.e., one, two, three, four, etc. The terms "a plurality" can be understood to include any integer number greater than or equal to two, i.e., two, three, four, five, etc. The term "connection" can include both indirect "connection" and a direct "connection."

As used herein, the term "about" modifying the quantity of an ingredient, component, or reactant of the invention employed refers to variation in the numerical quantity that can occur, for example, through typical measuring and liquid handling procedures used for making concentrations or solutions. Furthermore, variation can occur from inadvertent error in measuring procedures, differences in manufacture, source, or purity of the ingredients employed to make the compositions or carry out the methods, and the like. The terms "about" or "substantially" are intended to include the degree of error associated with measurement of the particular quantity based upon the equipment available at the time of the filing of the application. For example, about can include a range of ±8%, or 5%, or 2% of a given value. In another aspect, the term "about" means within 5% of the reported numerical value. In another aspect, the term "about" means within 10, 9, 8, 7, 6, 5, 4, 3, 2, or 1% of the reported numerical value.

Various processes are used to form a micro-chip that will packaged into an integrated circuit (IC) fall in four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE), and more recently, atomic layer deposition (ALD) among others. Removal/etching is any process that removes material from the wafer. Examples include etching process (either wet or dry), reactive ion etching (RIE), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implant dopants. Films of both conductors (e.g., aluminum, copper, etc.) and insulators (e.g., various forms of silicon dioxide, silicon nitride, etc.) are used to connect and isolate electrical components. Selective doping of various regions of the semiconductor substrate allows the conductivity of the substrate to be changed with the application of voltage.

Reference will now be made in detail to the embodiments of the present invention, examples of which are illustrated in the accompanying drawings, where like reference numerals refer to like elements throughout. The present invention is directed towards forming an interconnect contact between two adjacent nanosheet transistors. The upper spacer is wrapped around at least three sides of the gate region of each of the transistors. The interconnect has a horizontal section that extends horizontally across multiple gate regions and the interconnect includes a protrusion that extends into the source/drain region. The protrusion is perpendicular to the horizontal section. The horizontal section extends perpendicular to the gate direction and the protrusion extends parallel to the gate direction. The horizontal section extends to the backside of the nanosheet transistors, where the horizontal section has a first width. The protrusion extends to the backside of the nanosheet transistors, where the protrusion has a second width. The first width and the second width are measured in parallel to the gate direction. The second width is larger than the first width.

FIG. 1 illustrates a top-down view of multiple devices, in accordance with the embodiment of the present invention. The cross-section X extends horizontally through the nano devices, nano stacks, or transistors of one of the devices. Cross section Y1 is perpendicular to cross section X, where cross section Y1 is through a gate region that spans across multiple nano stacks. Cross section Y2 is perpendicular to cross section X, where cross section Y2 is through a source/drain region that spans across multiple nano stacks. Cross sections Y1 and Y2 are in parallel with the gate direction and cross section X is perpendicular to the gate direction.

Figures 2, 3:
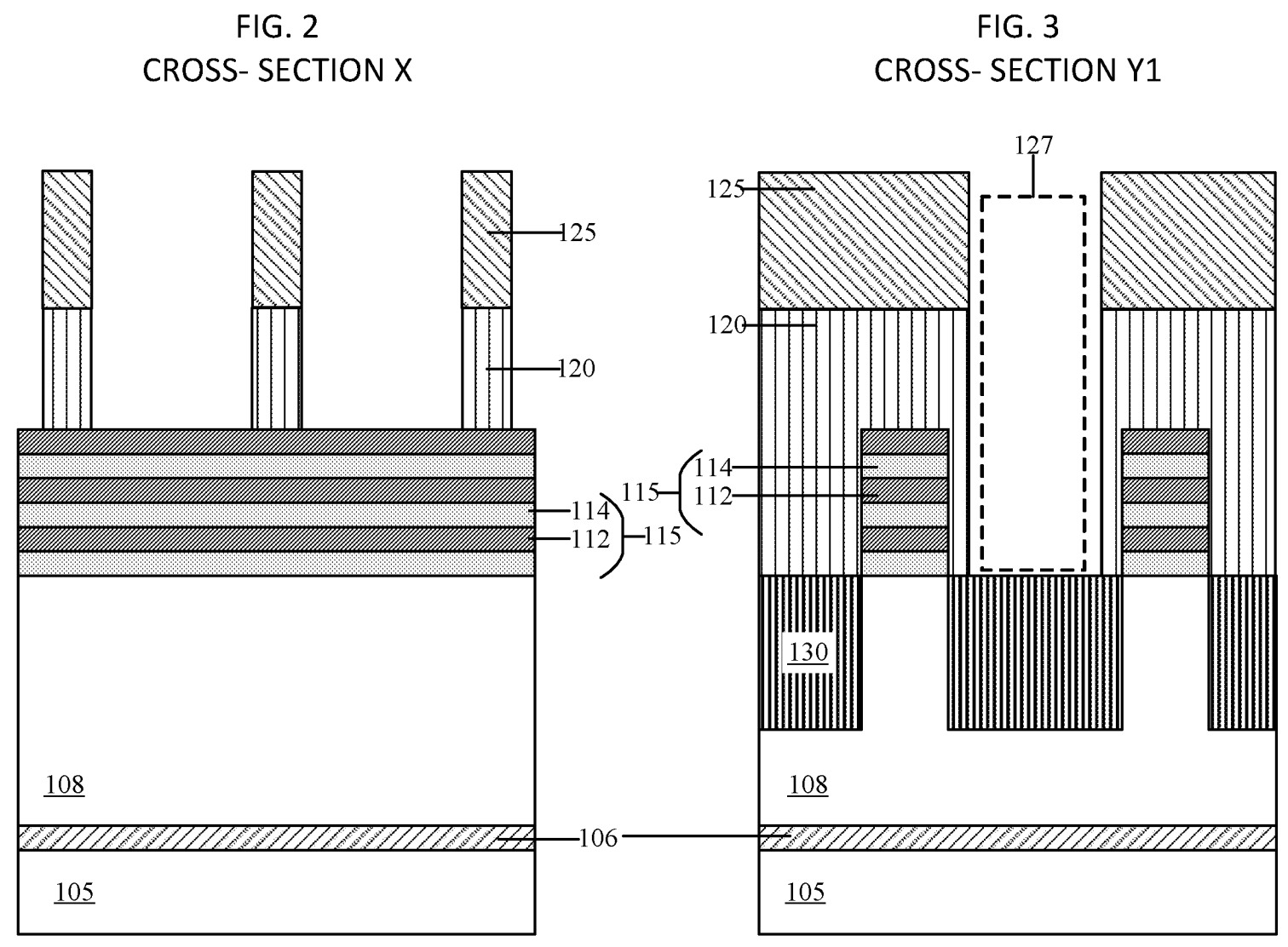
Figure 4:
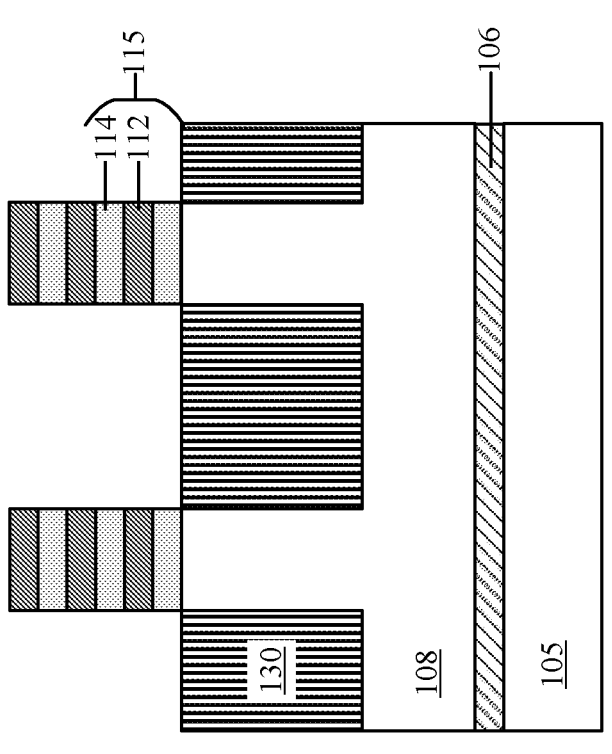
FIG. 4 illustrates a cross section Y2 of the source/drain region after the formation and patterning of the dummy gate, in accordance with the embodiment of the present invention.

Referring now to FIGS. 2, 3, and 4, illustrate a structure during an intermediate step of a method of fabricating a nanosheet transistor structure according to an embodiment of the invention. FIGS. 2, 3, and 4 illustrate the processing stage after the formation and patterning of the dummy gate. FIG. 2 illustrates a first substrate 105, an etch stop 106, a second substrate 108, a plurality of alternating layers 115, a dummy gate 120, and a hardmask 125.

The first substrate 105 and the second substrate 108 can be, for example, a material including, but not necessarily limited to, silicon (Si), silicon germanium (SiGe), Si:C (carbon doped silicon), carbon doped silicon germanium (SiGe:C), III-V, II-V compound semiconductor or another like semiconductor. In addition, multiple layers of the semiconductor materials can be used as the semiconductor material of the substrate 105. In some embodiments, first substrate 105 and the second substrate 108 includes both semiconductor materials and dielectric materials. The semiconductor first substrate 105 and the second substrate 108 may also comprise an organic semiconductor or a layered semiconductor such as, for example, Si/SiGe, a silicon-on-insulator or a SiGe-on-insulator. A portion or the entire semiconductor first substrate 105 and the second substrate 108 may also be comprised of an amorphous, polycrystalline, or monocrystalline. The semiconductor first substrate 105 and the second substrate 108 may be doped, undoped or contain doped regions and undoped regions therein. The etch stop 106 can be comprised of, for example, epitaxial SiGe or SiO2, or another suitable material.

The alternating layers 115 includes a plurality of channel layers 112 (e.g., Si nano sheets), a plurality of sacrificial layers 114. The plurality of sacrificial layers 114 can be comprised of SiGe, where Ge is in the range of about 15% to 35%. The plurality of channel layers 112 can be comprised of, for example, Si. A dummy gate 120 is formed on top of the top layer of the alternating layers 115 and a hardmask 125 is formed on top of the dummy gate. The dummy gate 120 and the hardmask 125 are pattern to form a plurality of columns on top of the alternating layers 115.

FIG. 3 illustrates that the alternating layers 115 were separated into a plurality of sheets or stacks, where trenches (not shown) are formed in the second substrate 108 during the etching of the alternating layers 115. The trenches are filled with a shallow trench isolation layer 130. Portions of the alternating layer 115 sheets are enclosed by the dummy gate 120. The dummy gate 120 is pattern to separate the dummy gate 120 to surround portions of adjacent alternating sheets. The gate cut patterning is performed early in the gate hardmask 125 such that etching of the dummy gate 120 causes a trench 127 to be formed between the gate ends over adjacent alternating layer sheets. The trench 127 exposes a top surface of the shallow trench isolation layer 130. The dummy gate 120 does not form a continuous column over adjacent sheets of the alternating layers 115. By separating the dummy gate 120 into multiple sections allows for the formation of a gate spacer (e.g., the upper spacer 135) covering gate ends (as indicated in FIG. 1) prior to the formation a power via that extends to the backside of the nanosheet transistor.

Figures 5, 6:
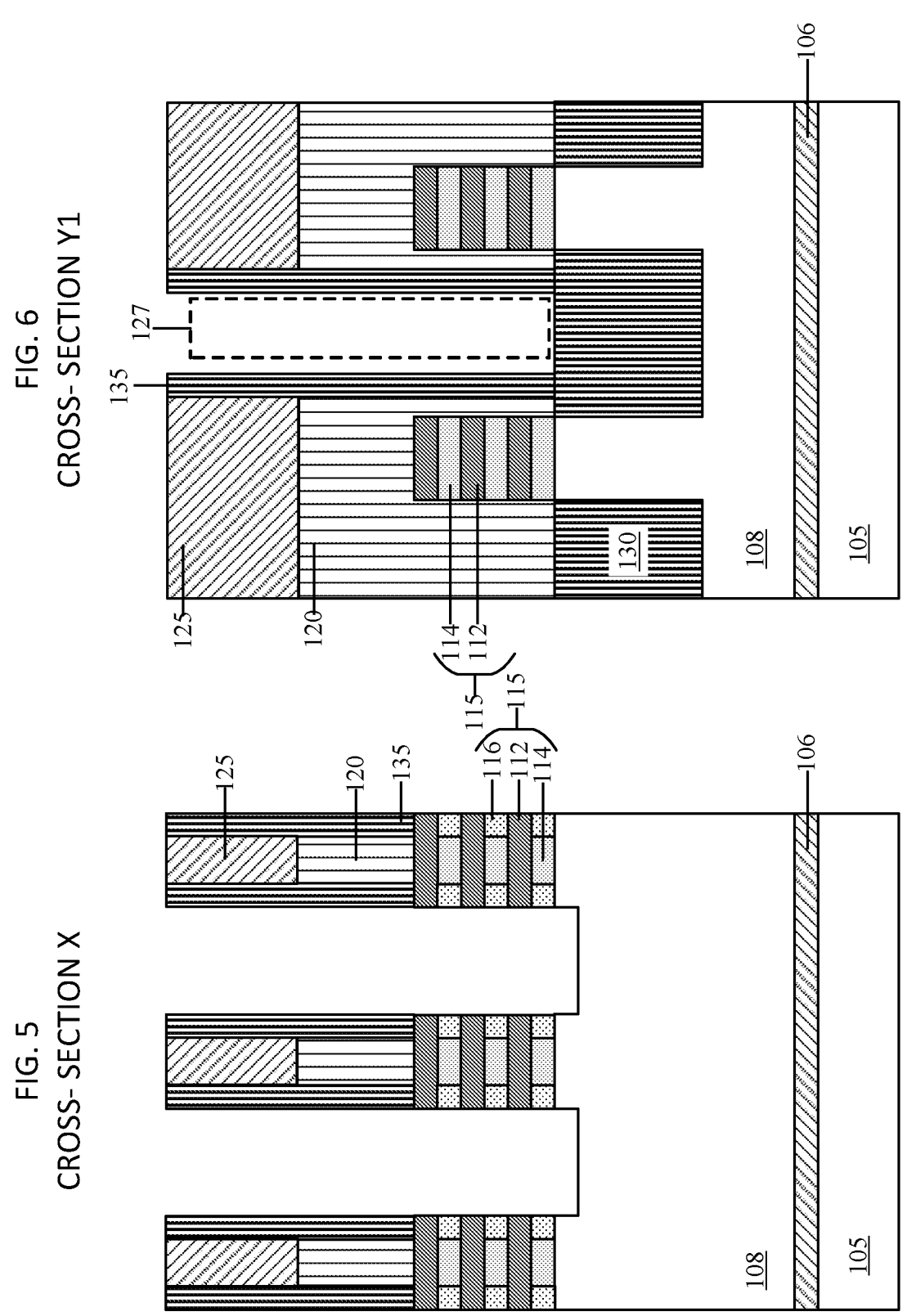
FIG. 5 illustrates a cross section X of the nano stack after the formation of the upper spacer, patterning of the alternating layers, and formation of the inner spacer, in accordance with the embodiment of the present invention.
FIG. 6 illustrates a cross section Y1 of the gate region after the formation of the upper spacer, patterning of the alternating layers, and formation of the inner spacer, in accordance with the embodiment of the present invention.
Figure 7:
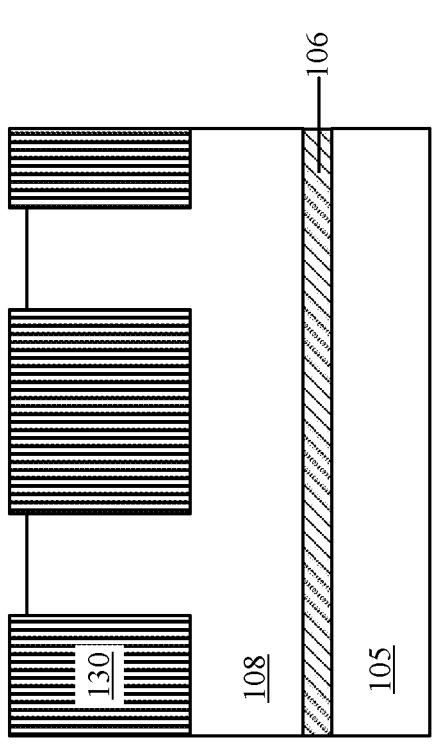
FIG. 7 illustrates a cross section Y2 of the source/drain region after the formation of the upper spacer, patterning of the alternating layers, and formation of the inner spacer, in accordance with the embodiment of the present invention.

FIGS. 5, 6, and 7 illustrate the processing stage after the formation of the upper spacer 135, patterning of the alternating layers 115, and formation of the inner spacer 116. An upper spacer 135 is formed around the dummy gate 120 and around the hardmask 125, such that the upper spacer 135 wraps/surrounds the dummy gate 120 and the hardmask 125. As seen by FIG. 1, the upper spacer 135 has at least two sections that are in parallel to each other (e.g., that they extend in the gate direction) and at least one section that is perpendicular to the parallel sections (e.g., that is perpendicular to the gate direction). Therefore, the upper spacer 135 is wrapped around the dummy gate 120, so that the upper spacer 135 is in direct contact with three or more sides of the dummy gate 120. As seen in FIG. 5, the upper spacer 135 is located on top of the top layer of the alternating layers 115, while in FIG. 6 the upper spacer 135 extends up from the shallow trench isolation layer 130. The width of the trench 127 is narrowed because of the formation of the upper spacer 135. The alternating layers 115 are patterned to form a plurality of alternating layer 115 columns and to form the source/drain regions. The plurality of sacrificial layers 114 are recessed to form space around the ends of the channel layers 112. This empty space is filled in with an inner spacer 116.

Figures 8, 9:
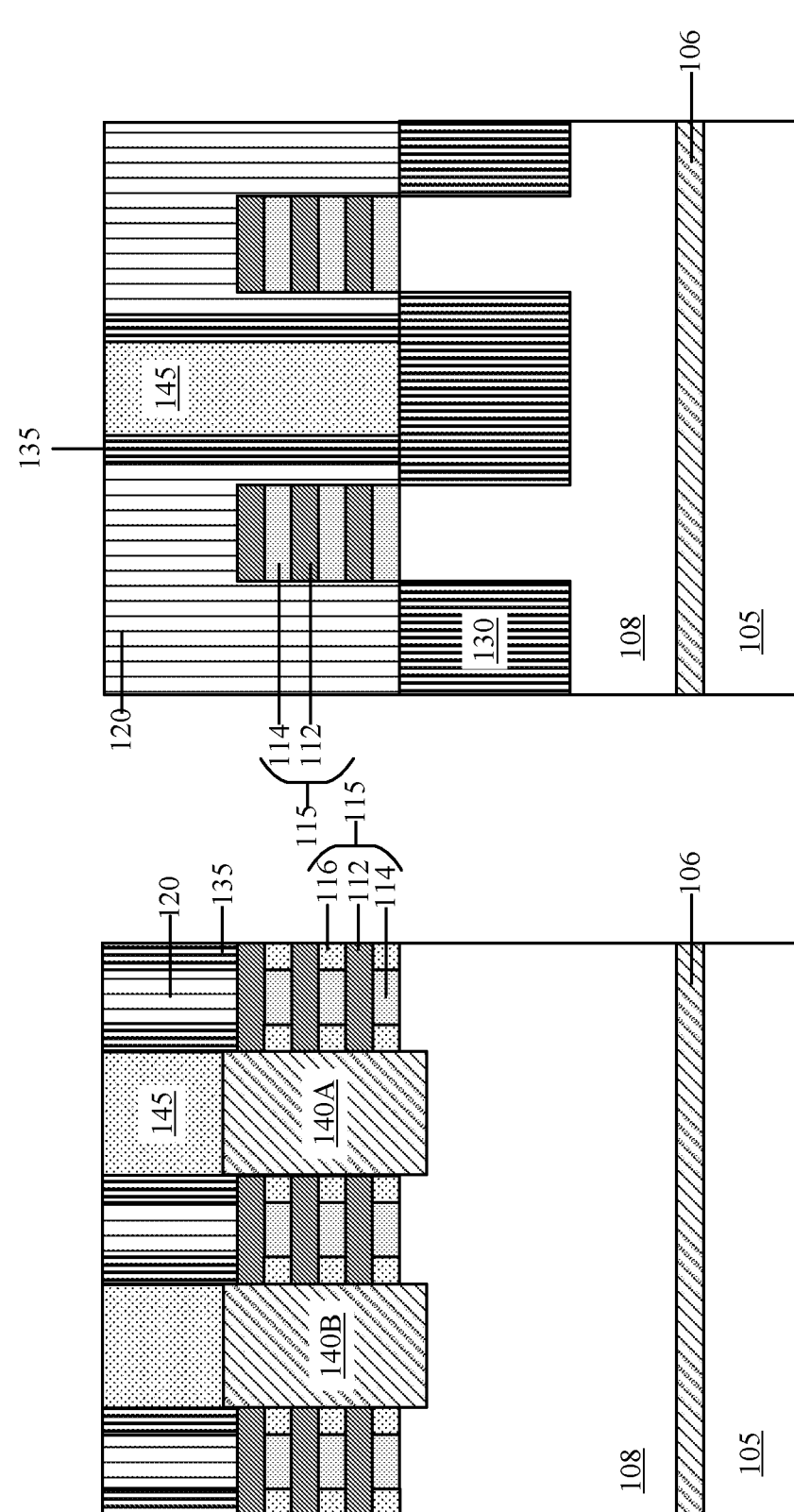
FIG. 8 illustrates a cross section X of the nano stack after the formation of a source/drain epi and the formation of a frontside interlayer dielectric layer, in accordance with the embodiment of the present invention.
FIG. 9 illustrates a cross section Y1 of the gate region after the formation of a source/drain epi and the formation of a frontside interlayer dielectric layer, in accordance with the embodiment of the present invention.
Figure 10:
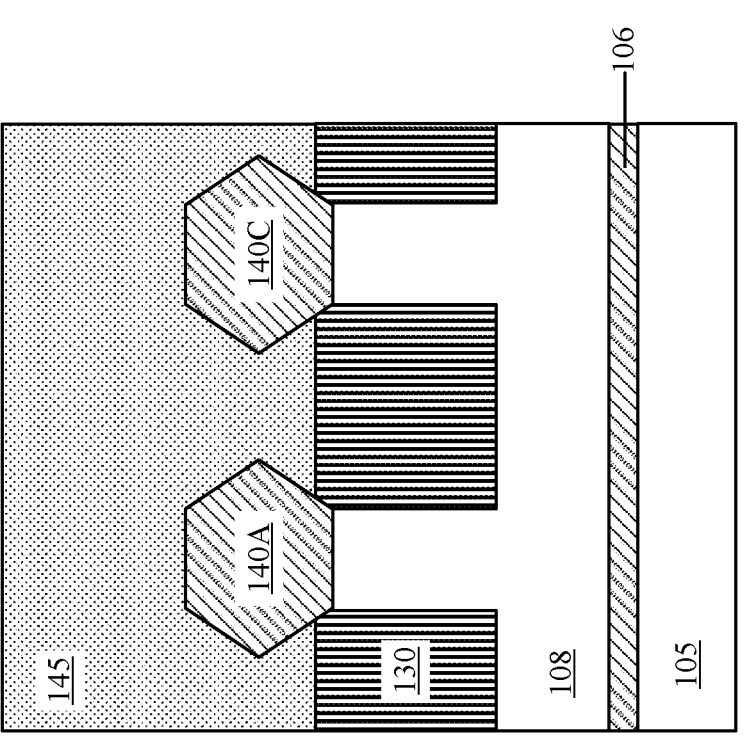
FIG. 10 illustrates a cross section Y2 of the source/drain region after the formation of a source/drain epi and the formation of a frontside interlayer dielectric layer, in accordance with the embodiment of the present invention.

FIGS. 8, 9, and 10 illustrate the processing stage after the formation of a source/drain epi 140A, 140B, and 140C and the formation of a frontside interlayer dielectric layer 145. The source/drain epi 140A, 140B, and 140C are formed in the source/drain region located between the alternating layers 115 columns. A frontside interlayer dielectric layer 145 is formed on top of the source/drains epi 140A, 140B, and 140C. The frontside interlayer dielectric layer 145 material fills the empty space of trench 127.

The source/drain epis 140A, 140B, and 140C, can be for example, a n-type epitaxy, or a p-type epitaxy. For n-type epitaxy, an n-type dopant selected from a group of phosphorus (P), arsenic (As) and/or antimony (Sb) can be used. For p-type epitaxy, a p-type dopant selected from a group of boron (B), gallium (Ga), indium (In), and/or thallium (TI) can be used. Other doping techniques such as ion implantation, gas phase doping, plasma doping, plasma immersion ion implantation, cluster doping, infusion doping, liquid phase doping, solid phase doping, and/or any suitable combination of those techniques can be used. In some embodiments, dopants are activated by thermal annealing such as laser annealing, flash annealing, rapid thermal annealing (RTA) or any suitable combination of those techniques.

Figures 11, 12:
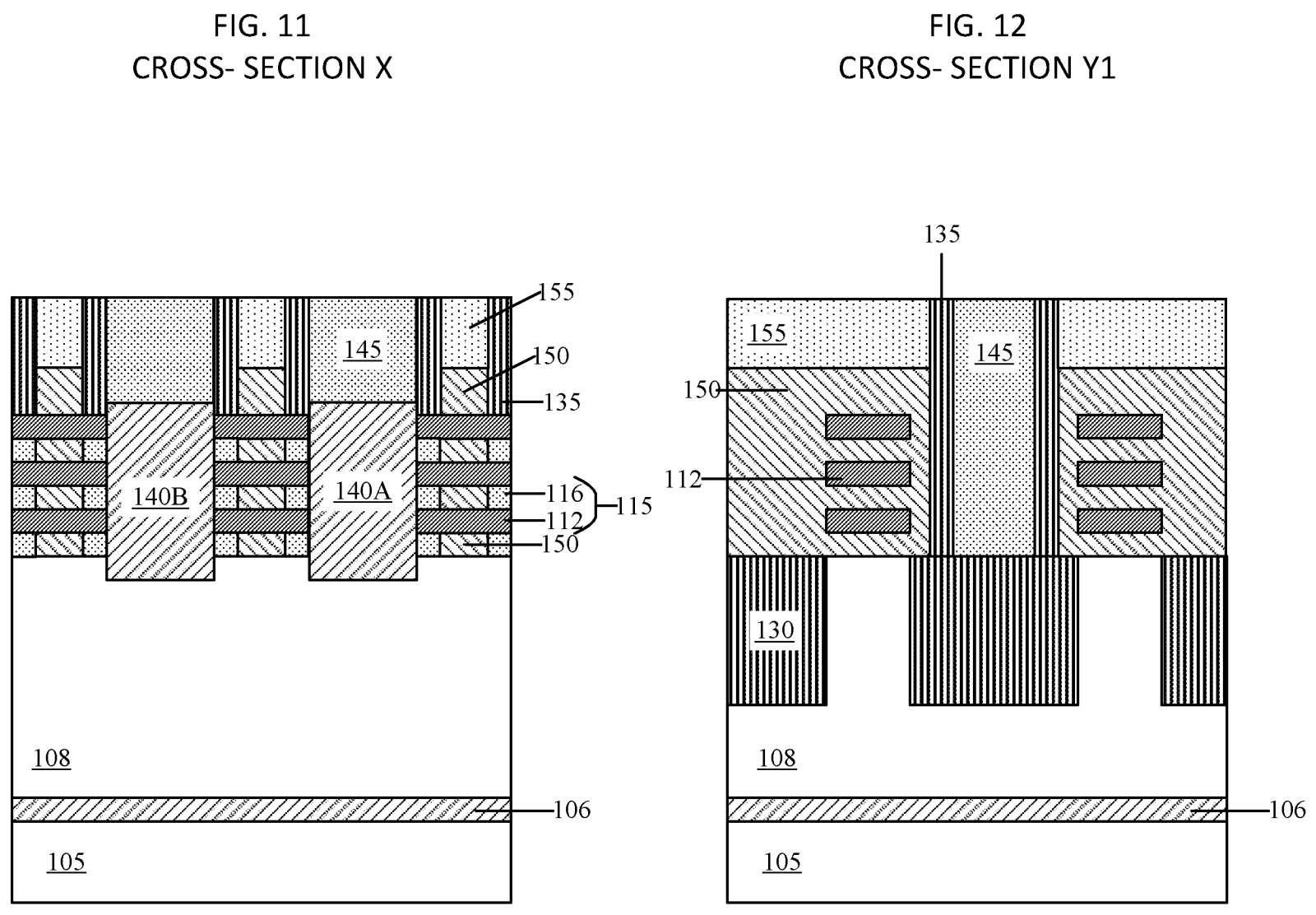

FIGS. 11, and 12 illustrate the processing stage after the removal of the dummy gate 120 and the plurality of sacrificial layers 114, and the formation of a gate 150 and a gate cap 155. The dummy gate 120 and the plurality of sacrificial layers 114 are selectively removed to create an empty space around the channel layers 112. A gate 150 is formed around the channel layers 112 and extends above the top channel layer 112. The gate 150 can be comprised of, for example, a gate dielectric liner, such as high-k dielectric like $HfO_2$, $ZrO_2$, $HfL_aO_x$, etc., and work function layers, such as TIN, TiAlC, TiC, etc., and conductive metal fills, like W. A gate cap 155 is formed on top of the gate 150 after gate recess, where the gate cap 155 is comprised of a dielectric material. As seen in FIG. 12, the gate 150 and the gate cap 155 are flush against a sidewall of the upper spacer 135. The upper spacer 135, or gate spacer, is wrapped/surrounds the gate 150 and the gate cap 155.

Figure 15:
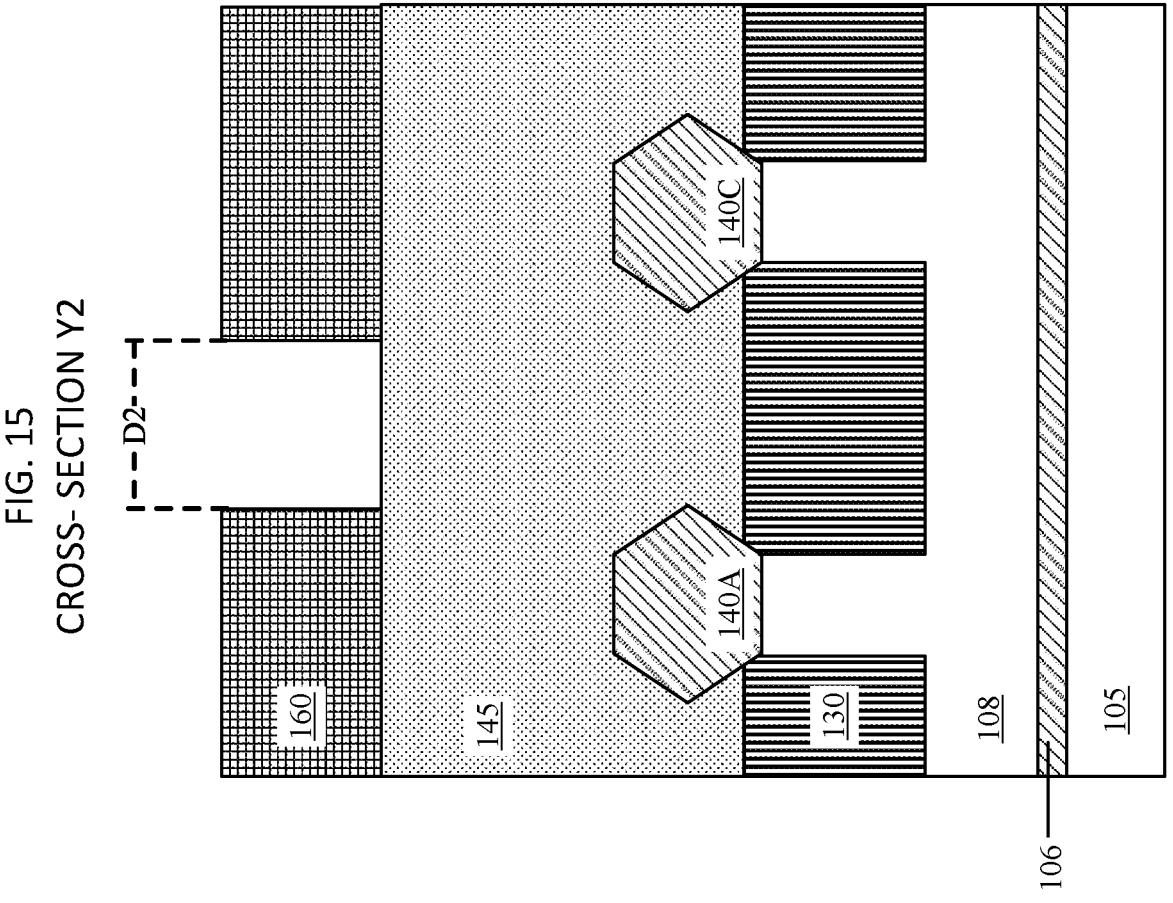
FIG. 15 illustrates a cross section Y2 of the source/drain region after the formation and patterning of a lithography layer, in accordance with the embodiment of the present invention.

FIGS. 13, 14, and 15 illustrate the processing stage after the formation and patterning of a lithography layer 160. Additional frontside interlayer dielectric layer 145 material is formed on top of the gate cap 155 and the upper spacer 135. A lithography layer 160 is formed on top of the frontside interlayer dielectric layer 145. The lithography layer 160 is patterned to form a plurality of trenches in the lithography layer 160, where the trenches extend distance D1 and D2, respectively.

Figures 18A, 18B:
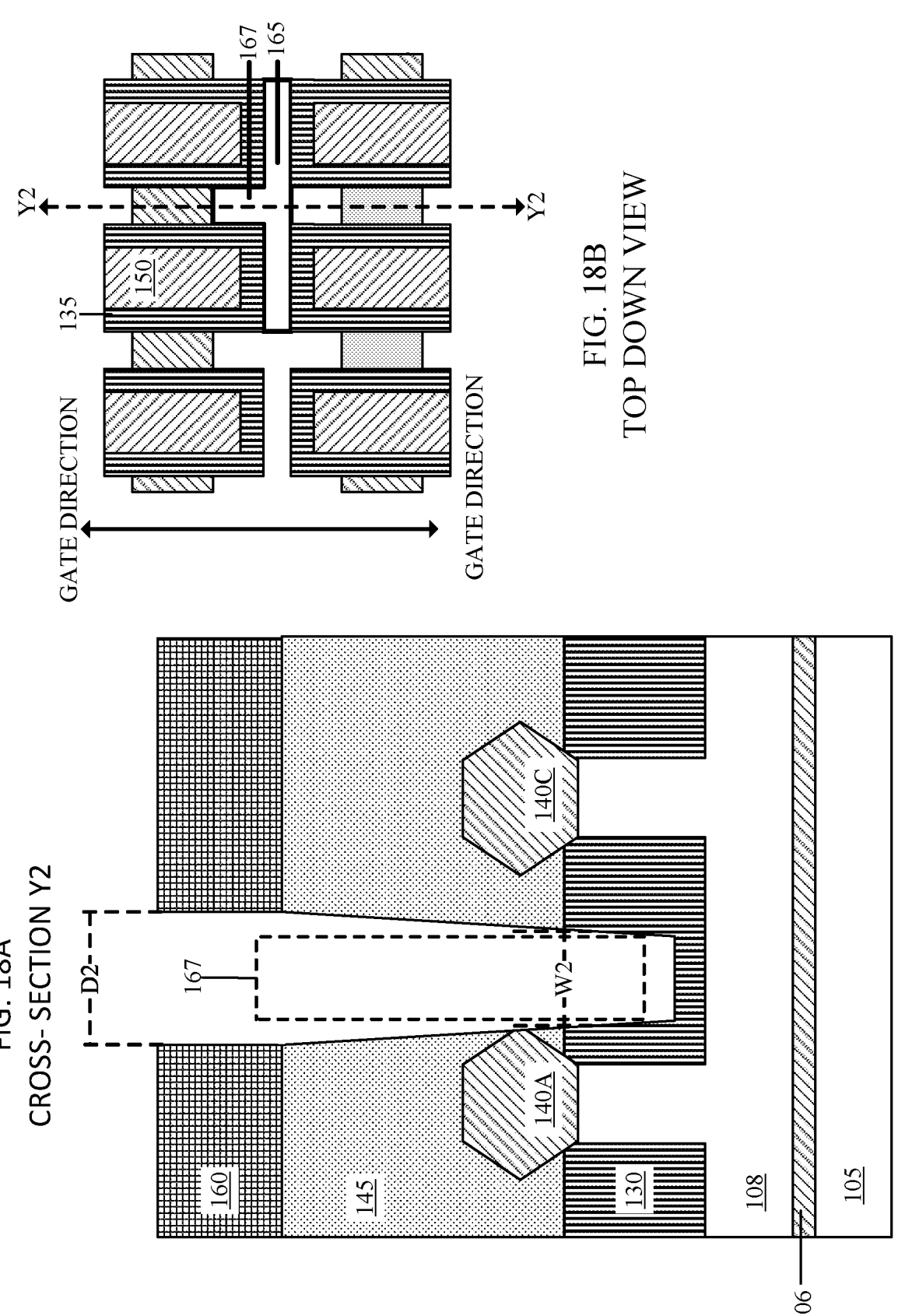
FIG. 18A illustrates a cross section Y2 of the source/drain region after the formation of a backside contact trench, in accordance with the embodiment of the present invention.
FIG. 18B illustrates a top-down view of that illustrates the location and shape of the contact trench, in accordance with the embodiment of the present invention.

FIGS. 16, 17, 18A and 18B illustrate the processing stage after the formation of a backside contact trench 165, 167. A backside contact trench 165, 167 is formed in the frontside interlayer dielectric layer 145 and the shallow trench isolation layer 130, self-aligned to the gate cap 155 or upper spacer 135. For example, the frontside interlayer dielectric layer 145 and the shallow trench isolation layer 130 can be, comprised of, SiO2 based material. The gate cap 155 and the upper spacer 135 can be comprised of, for example, a nitride-based material. The first backside contact trench 165 forms a horizontal trench wherein the horizontal trench extends perpendicular to the gate direction. The second backside contact trench 167 forms a protruding trench that extends off the first backside contact trench 165, where the second backside contact trench 167 extends parallel to the gate direction. The second backside contact trench 167 is perpendicular to the first backside contact trench 165. FIG. 18B is a top-down view that illustrates shape and location of the first backside contact trench 165 and the second backside contact trench 167. The first backside contact trench 165 forms a horizontal trench that extends perpendicular to the gate direction, where the first backside contact trench 165 is in contact with the upper spacer 138 that covers the end of the gate 150. As illustrated in FIG. 18B the first backside contact trench 165 in in contact with four different upper spacer 135 that are located around four different gate 150, respectively. The second backside contact trench 167 extends off the first backside contact trench 165, such that the second backside contact trench 167 is parallel to the gate direction. The second backside contact trench 167 is located between the upper spacer 135 segments that are located around adjacent gates 150.

The first backside contact trench 165 has a width of W1 and the second backside contact trench 167 has a width W2, where width W2 is greater than width W1. As seen in FIG. 1, the widths W1 and W2 are measured in parallel with the gate 150 direction. As illustrated in FIG. 18, the second backside trench 167 is formed adjacent to the source/drain epi 140A. The second backside trench 167 may expose a portion of the source/drain epi 140A, or a small amount of the frontside interlayer dielectric layer 145 can be located between the source/drain epi 140A and the second backside contact trench 167.

Figures 19, 20:
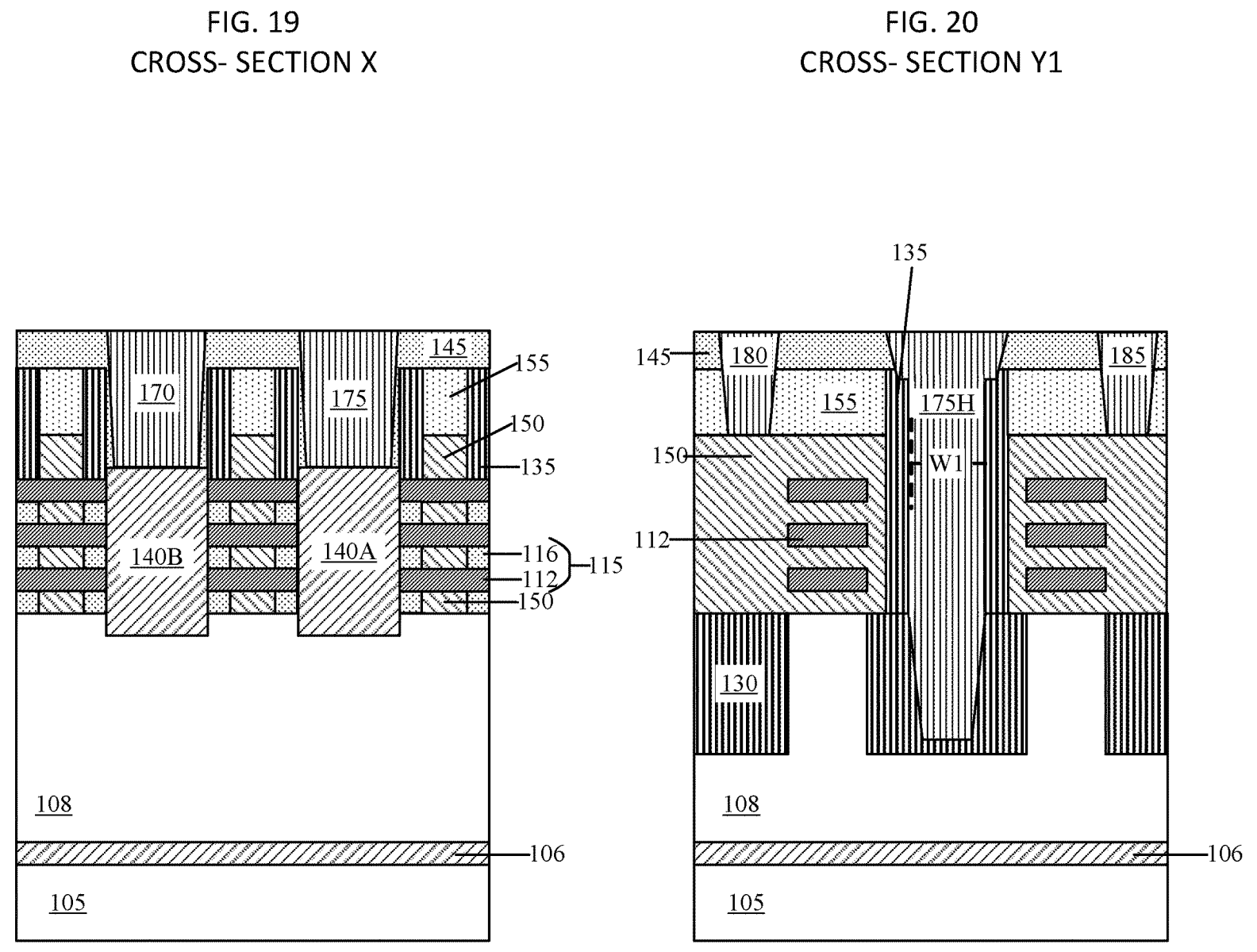
Figure 21:
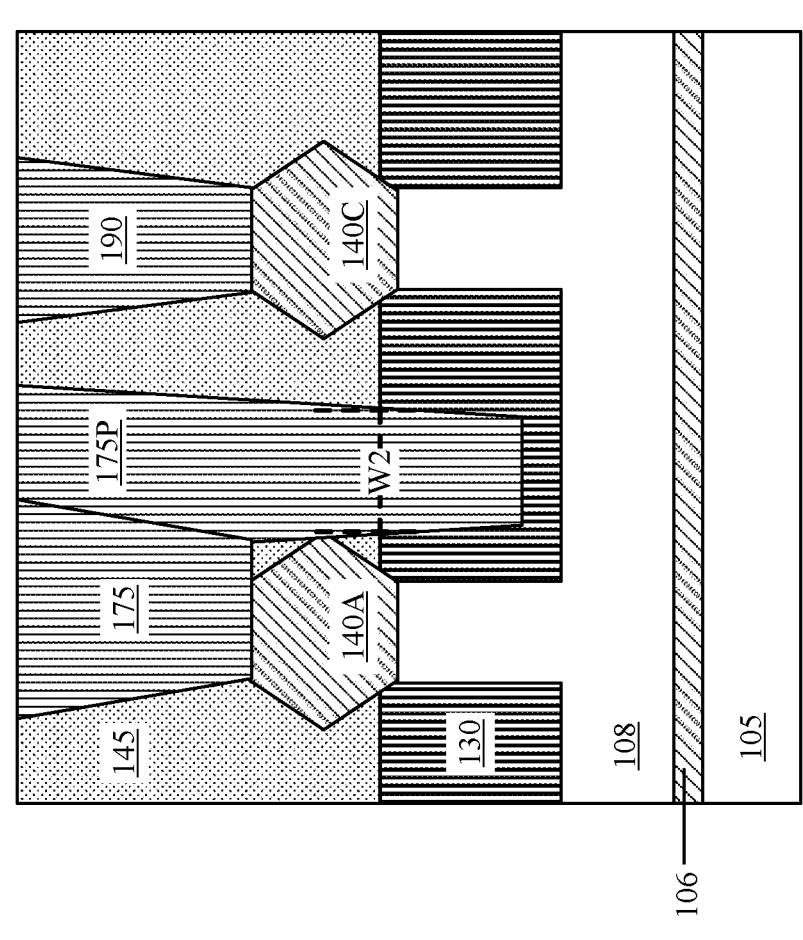
FIG. 21 illustrates a cross section Y2 of the source/drain region after the formation of a plurality of contacts, in accordance with the embodiment of the present invention.

FIGS. 19, 20, and 21 illustrate the processing stage after the formation of a plurality of contacts. A plurality of trenches (not shown) are formed in the gate cap 155 and the frontside interlayer dielectric layer 145. These trenches are filled in with a conductive metal to form a plurality of contacts 170, 175, 175P, 175H, 180, 185, and 190. The first contact 170 is located above source/drain epi 140B. The first gate contact 180 and the second gate contact 185 are located above the gate 150 of a first transistor and a second transistor, respectively. The third contact 190 is located above source/drain epi 140C. The second contact 175 is located above source/drain epi 140A. The second contact 175, or power via 175, includes a horizontal contact section 175H and a protrusion contact section 175P, as illustrated in FIGS. 1, 20 and 21. The horizontal contact section 175H extends perpendicular to the gate direction and the protrusion contact section 175P extends parallel to the gate direction. Both the horizontal contact section 175H and the protrusion contact section 175P extends downwards into the shallow trench isolation layer 130. As illustrated in FIGS. 20 and 21, the horizontal contact section 175H and the protrusion contact section 175P extend far enough into the shallow trench isolation layer 130 to allow for backside connection, which will be described in further detail below. The horizontal contact section 175H has a width W1 and the protrusion contact section 175P has a width W2, where the widths are measure in parallel to the gate direction. FIG. 20 illustrates width of the horizontal contact section 175H, while FIG. 21 illustrates the width of the protrusion contact section 175P. FIG. 1 illustrates the horizontal contact section 17H and the protrusion contact section 175P how the two sections are orientated. FIG. 1 shows how the horizontal contact section 175H is in contact with upper spacer 135 that surrounds a plurality of different gates 150. The horizontal contact section 175H extends outwards from both sides of protrusion contact section 175P. The protrusion contact section 175P extends in parallel to adjacent gates 150 to extend over the source/drain epi 140A. Furthermore, FIG. 1 illustrates the orientations of the width W1 and W2. FIG. 21 illustrates how the second contact 175 is connected to protrusion contact section 175P. FIG. 21 illustrates that the second contact 175 and the protrusion contact section 175P as being separated components, but these components are a single contact.

Figures 22, 23:
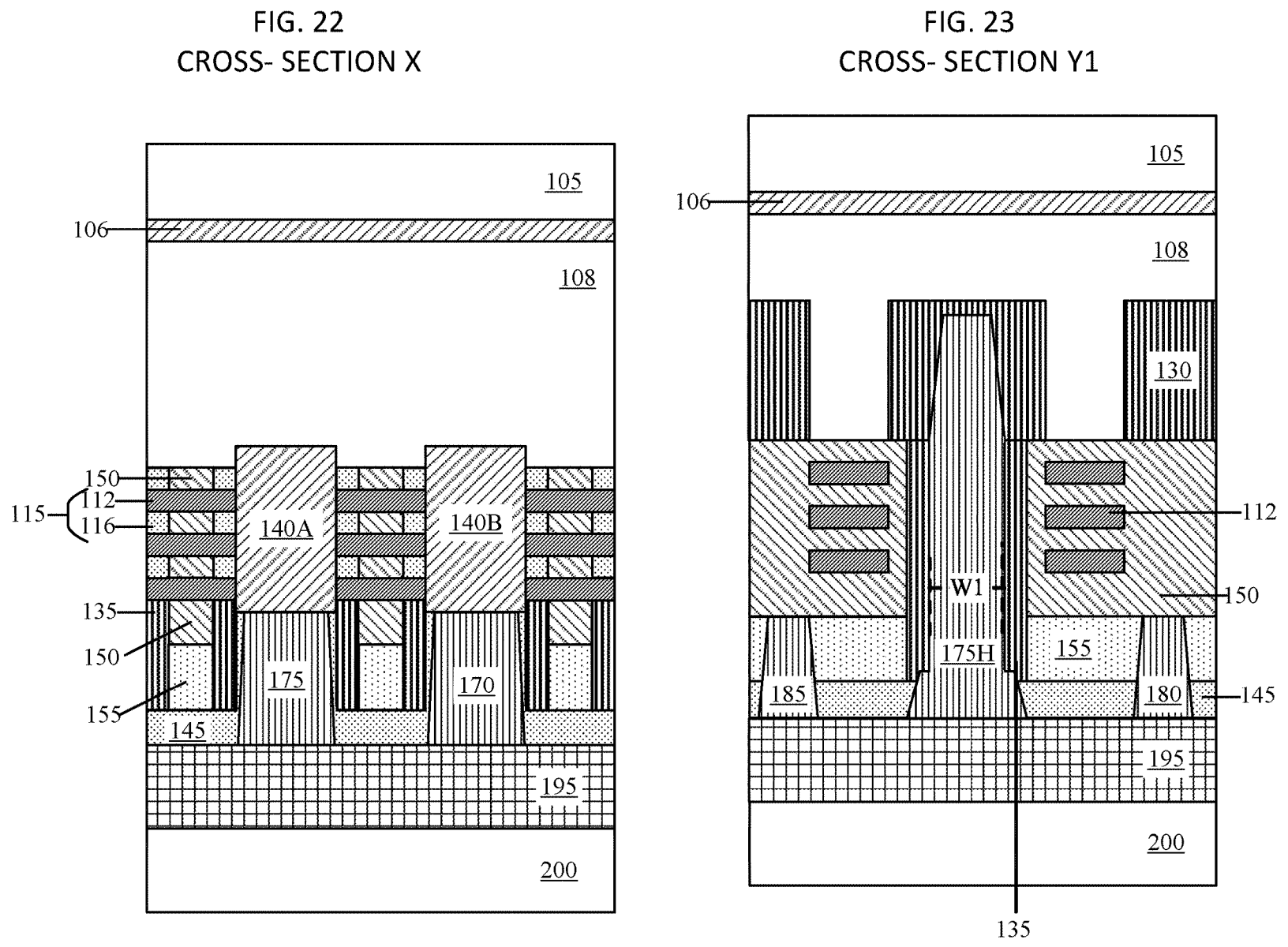
Figure 24:
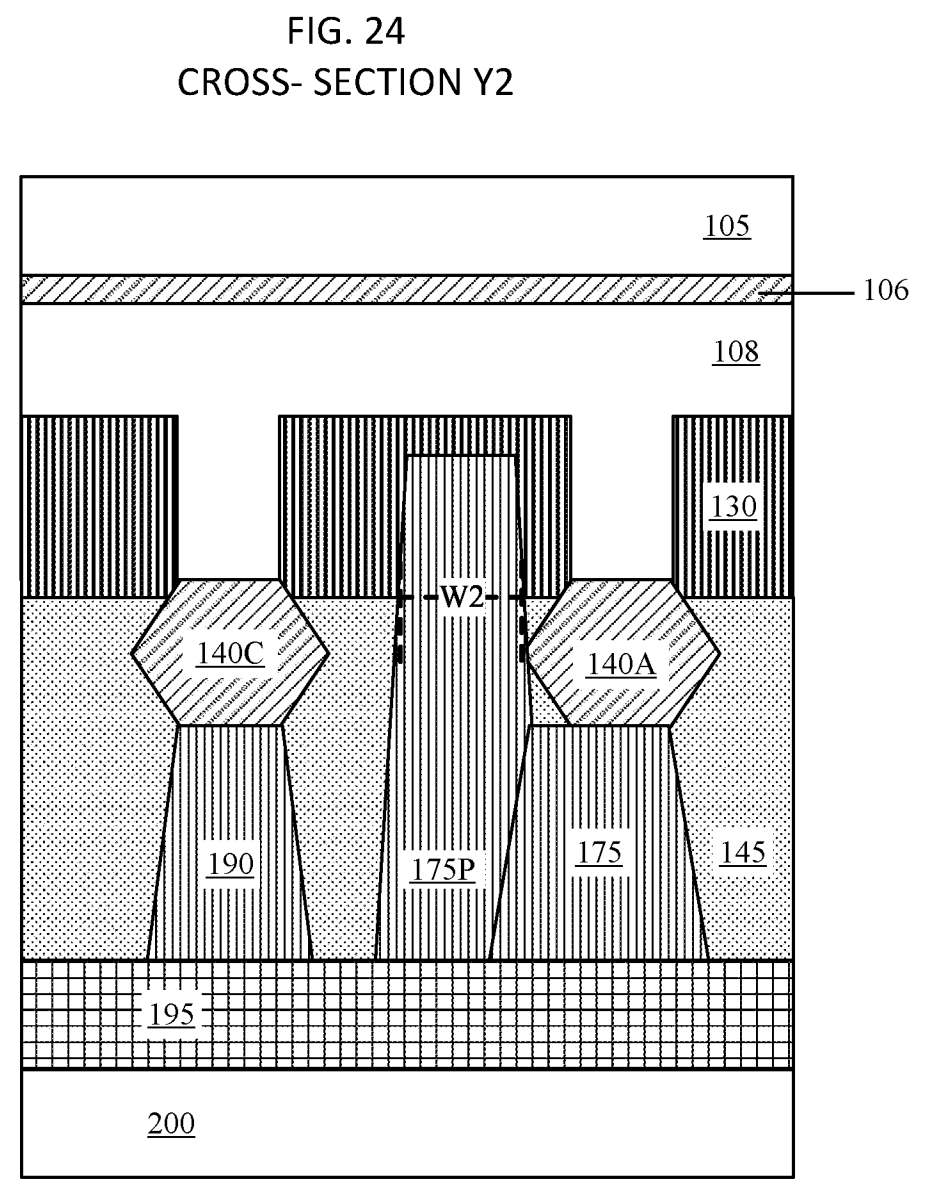

FIGS. 22, 23, and 24 illustrate the processing stage after the formation of back-end-of-the-line layers and the carrier wafer, and flipping over the device for backside processing. The back-end-of-the-line (BEOL) layers 195 are formed on top of the plurality of contacts 170, 175, 175P, 175H, 180, 185, and 190 and on top of the frontside interlayer dielectric layer 145. A carrier wafer 200 is attached to the top of the BEOL layers 195. After the carrier wafer 200 is attached then the wafer/device is flipped over to allow for the backside of the device to be processed.

Figures 25, 26:
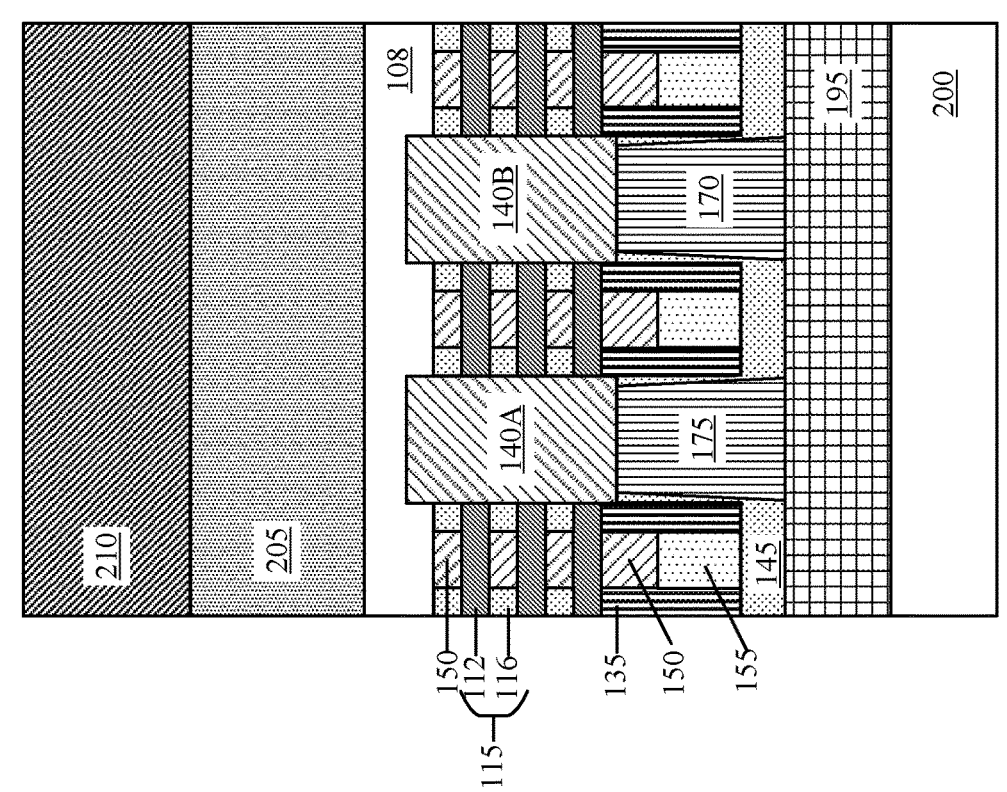
FIG. 25 illustrates a cross section X of the nano stack after the formation of a backside-power-distribution-network and a backside contact, in accordance with the embodiment of the present invention.
FIG. 26 illustrates a cross section Y1 of the gate region after the form formation of a backside-power-distribution-network and a backside contact, in accordance with the embodiment of the present invention.
Figure 27:
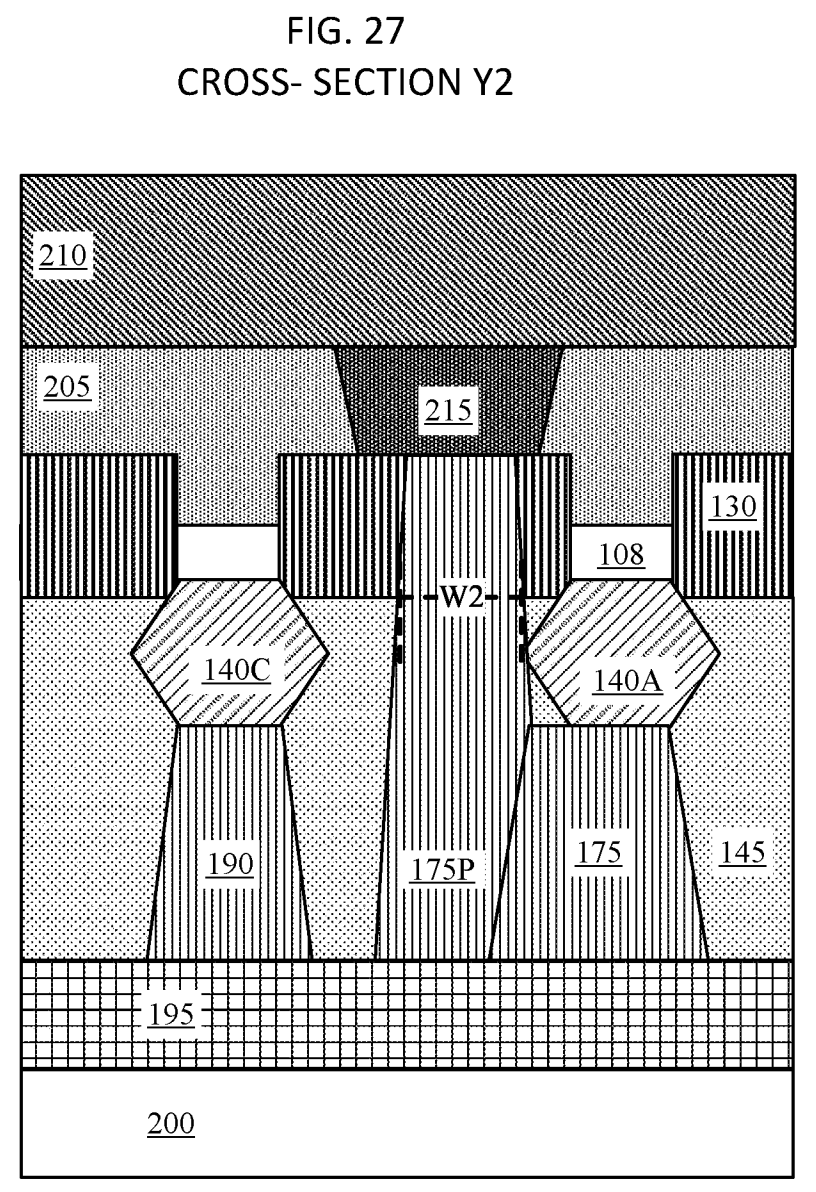

FIGS. 25, 26, and 27 illustrate the processing stage after the formation of a backside-power-distribution-network 210 and a backside contact 215. The first substrate 105 and the etch stop 106 is removed by, for example, chemical mechanical processing (CMP). The second substrate 108 is etched to remove most of its material while leaving of a portion of the second substrate 108 that covers the backside of the source/drain epi 140A, 140B, 140C, and the gate 150. The removal these materials exposes the backside surface of the shallow trench isolation layer 130 and exposes the backside surface of the horizontal contact section 175H and a backside surface of the protrusion contact section 175P. A backside interlayer dielectric layer 205 is formed on the exposed surfaces of the second substrate 108, the shallow trench isolation layer 130, the horizontal contact section 175H, and the protrusion contact section 175P. A trench (not shown) is formed in the backside interlayer dielectric layer 205 that exposes the backside surfaces of the horizontal contact section 175H and the protrusion contact section 175P. The trench (not shown) also exposes a portion of the shallow trench isolation layer 130 located against to the horizontal contact section 175H and the protrusion contact section 175P. The trench is filled with a conductive metal to form the backside contact 215. The backside-power-distribution-network 210 is formed on top of the backside interlayer dielectric layer 205 and the backside contact 215. The width W1 is substantially constant as the horizontal contact section 175H extends along the upper spacer 135 towards the backside of the nanosheet transistor. The width W2 is substantially constant as the protrusion contact section 175P extends towards the backside of the nanosheet transistor, wherein the width W2 is larger than the width W1. Since the width W1 the horizontal contact section 175H and the width W2 of the protrusion contact section 175P are substantially wide as they extend to the backside of the nanosheet transistors causing the resistance of horizontal contact section 175H and the protrusion contact section 175P to be lowered. The wide structure of the horizontal contact section 175H and the protrusion contact section 175P was achievable because the dummy gate was cut prior to the formation of the upper spacer 135. The upper spacer 135 acts as a spacer/barrier from the horizontal contact section 175H and the protrusion contact section 175P from shorting with the gate 150. One upper spacer 135 is able to act as a barrier for the horizontal contact section 175H and the protrusion contact section 175P, since the upper spacer 135 is wrapped around the gate 150 as illustrated in FIG. 1.

While the invention has been shown and described with reference to certain exemplary embodiments thereof, it will be understood by those skilled in the art that various changes in form and details may be made therein without departing from the spirit and scope of the present invention as defined by the appended claims and their equivalents.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the one or more embodiment, the practical application or technical improvement over technologies found in the marketplace, or to enable others of ordinary skill in the art to understand the embodiments disclosed herein.

What is claimed is:

1. A microelectronic device comprising:
a nanosheet transistor that includes a plurality of nanosheets;
a gate wrapped around the plurality of nanosheets;
an upper spacer located adjacent to the gate, wherein the upper spacer is in contact with at least three sides of the gate; and
a backside interconnect that is in contact with a first surface and a second surface of the upper spacer, wherein the first surface and the second surface are different surfaces.

2. The microelectronic device of claim 1, wherein the upper spacer includes a first section, a second section, and a third section, wherein the first section and the second section extend in a direction parallel to a gate direction.

3. The microelectronic device of claim 2, wherein the third section of the upper spacer extends perpendicular to the gate direction.

4. The microelectronic device of claim 3, further comprising:
a shallow trench isolation layer located beneath the gate; and
a gate cap located above the gate.

5. The microelectronic device of claim 4, wherein the third section of the upper spacer extends from the shallow trench isolation layer to the gate cap, wherein the third section of the upper spacer is in contact with the shallow trench isolation layer, the gate, and the gate cap.

6. A microelectronic device comprising:
a first nanosheet transistors adjacent to a second nanosheet transistor, wherein the first nanosheet transistor includes a plurality of first nanosheets, wherein the second nanosheet transistor includes a plurality of second nanosheets;
a source/drain located between the first nanosheet transistor and second nanosheet transistor;
a first gate wraps around the plurality of first nanosheets;
a second gate wraps around the plurality of second nanosheets;
a first upper spacer located adjacent to the first gate, wherein the first upper spacer is in contact with at least three sides of the first gate;
a second upper spacer located adjacent to the second gate, wherein the second upper spacer is in contact with at least three sides of the second gate;
a backside interconnect connected to the source/drain, wherein the backside interconnect is in contact with the first upper spacer and the second upper spacer, wherein the backside interconnect is in contact with a first surface and a second surface of the first upper spacer, wherein the first surface and the second surface are different surfaces, wherein the backside interconnect is in contact with a third surface and a fourth surface of the second upper spacer, wherein the third surface and the fourth surface are different surfaces.

7. The microelectronic device of claim 6, wherein the first upper spacer includes a first section, a second section, and a third section, wherein the second upper spacer includes a fourth section, a fifth section, and a sixth section, wherein the first section, the second section, the fourth section, and the fifth section extend parallel to a gate direction.

8. The microelectronic device of claim 7, wherein the third section and the sixth section extends perpendicular to the gate direction.

9. The microelectronic device of claim 8, further comprising:
a shallow trench isolation layer located beneath the first gate and beneath the second gate; and
a gate cap located above the first gate and the second gate.

10. The microelectronic device of claim 9, wherein the third section of the first upper space and the sixth section of the second upper spacer extends from the shallow trench isolation layer to the gate cap, wherein the third section of the first upper spacer is in contact with the shallow trench isolation layer, the first gate, and the gate cap, and wherein the sixth section of the second upper spacer is in contact with the shallow trench isolation layer, the second gate, and the gate cap.

11. The microelectronic device of claim 10, wherein the backside interconnect includes a protrusion section and a horizontal section.

12. The microelectronic device of claim 11, wherein the protrusion section extends in parallel to the gate direction and the horizontal section extends perpendicular to the gate direction.

13. The microelectronic device of claim 12, wherein the protrusion section is in contact with the second section of the first upper spacer and the protrusion section is in contact with the fourth section of the second upper spacer.

14. The microelectronic device of claim 13, wherein the horizontal section is in contact with the third section of the first upper spacer and the horizontal section is in contact with the sixth section of the second upper spacer.

15. The microelectronic device of claim 12, wherein the horizontal section and the protrusion section extend to a backside of the first and second nanosheet transistors.

16. The microelectronic device of claim 15, wherein the horizontal section has a first width as it extends towards the backside of the first and second nanosheet transistor, wherein the first width is measure in parallel with the gate direction.

17. The microelectronic device of claim 16, wherein the protrusion section has a second width as it extends towards the backside of the first and second nanosheet transistor, wherein the second width is measured in parallel with the gate direction.

18. The microelectronic device of claim 17, wherein the second width is larger than the first width.

* * * * *